United States Patent [19]

Skudera, Jr.

[11] Patent Number: 5,384,545
[45] Date of Patent: Jan. 24, 1995

[54] SEQUENTIAL CIRCUITRY FOR RECREATING CW COMPONENTS FROM CHIRP-Z PULSES

[75] Inventor: William J. Skudera, Jr., Oceanport, N.J.

[73] Assignee: The United States of America as represented by the Secretary of the Army, Washington, D.C.

[21] Appl. No.: 977,354

[22] Filed: Nov. 17, 1992

[51] Int. Cl.6 .................. H03K 5/159; G01R 23/175
[52] U.S. Cl. .................................. 327/284; 327/291; 327/105
[58] Field of Search ................ 328/29, 56, 28, 61, 328/14, 187, 188, 189; 324/76.23, 76.19

[56] References Cited

U.S. PATENT DOCUMENTS

| | | | |
|---|---|---|---|
| 3,068,405 | 12/1962 | Glazer et al. | 328/56 |
| 3,428,905 | 2/1969 | Fierston et al. | 328/56 |
| 3,510,782 | 5/1970 | Ralph et al. | 328/187 |
| 4,117,409 | 9/1978 | O'Brien | 328/56 |
| 4,504,785 | 3/1985 | Tucker et al. | 328/56 |
| 4,633,185 | 12/1986 | McPherson et al. | 328/56 |
| 4,994,740 | 2/1991 | Skudera, Jr. et al. | 324/72 |
| 5,179,438 | 1/1993 | Morimoto | 328/56 |

Primary Examiner—Timothy P. Callahan
Assistant Examiner—Dinh T. Le
Attorney, Agent, or Firm—Michael Zelenka; John M. O'Meara

[57] ABSTRACT

Use of inverse transforms regarding chirp-Z analysis is circumvented to enhance the chirp-Z output gain. Forward chirp-Z transform pulses relating to individual CW frequency components of interest in a composite signal, are gated to circuitry which replicates those pulses to recreate each such component for the time necessary to accomplish the intended analysis. This circuitry operates at the replicating rate necessary to separate the pulse replications by one-half the width of the pulses.

3 Claims, 2 Drawing Sheets

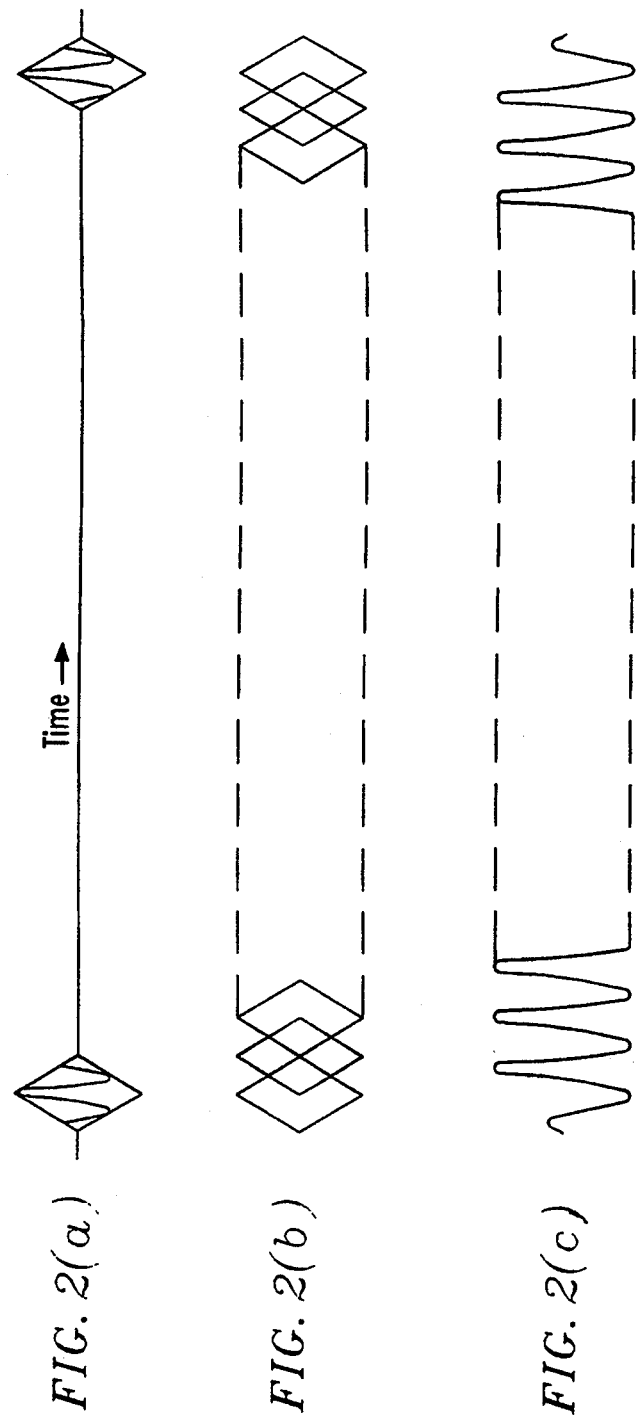

SEQUENTIAL CIRCUITRY FOR RECREATING CW COMPONENTS FROM CHIRP-Z PULSES

GOVERNMENT INTEREST

The invention described herein may be manufactured, used and licensed by or for the Government for governmental purposes without the payment to me of any royalty thereon.

BACKGROUND OF THE INVENTION

The present invention relates generally to signal spectrum analyzers and more particularly, to such analyzers wherein Chirp-Z forward transforms are utilized.

Conventional Chirp-Z signal analyzers utilize forward transforms to compress the individual continuous wave (hereinafter CW) components of the signal into segregated pulses or time intervals from which such components are then selectively reconstructed or expanded with inverse transforms. Considerable gain is inherent with Chirp-Z forward transforms, however, high attenuation is inherent with Chirp-Z inverse transforms. Consequently, Chirp-Z inverse transforms encumber the overall sensitivity of signal analyzers.

SUMMARY OF THE INVENTION

It is the general object of the present invention to recreate the individual CW components of a signal from the Chirp-Z pulses relating thereto.

It is a specific object of the present invention to accomplish the above-stated general object by utilizing sequential circuitry to repeatedly replicate the Chirp-Z pulses of selected CW components.

These and other objects are accomplished with the sequential circuitry of the present invention by separating the replications of each selected Chirp-Z pulse at one-half the width or duration of one such pulse. The replicated pulses therefore overlap to recreate the CW component contained therein and the sequential circuitry can replicate the selected Chirp-Z pulse for any reasonable period of time required by the functional purpose of the signal analyzer. In one preferred embodiment, the number of replications required are derived from a tapped delay line only. Another preferred embodiment derives the required number of replications by combining a tapped delay line for generating a group of replications, with circuitry for duplicating that group in powers of two.

DESCRIPTION OF THE DRAWINGS

FIG. 2(a) represents sequentially generated Chirp-Z pulses for one selected CW component.

FIG. 2(b) illustrates how the sequential circuitry the invention replicates a selected Chirp-Z pulse for the time duration between sequential occurrences thereof.

FIG. 2(c) represents the CW component recreation that results from the Chirp-Z pulse replication in FIG. 2(b).

DESCRIPTION OF THE PREFERRED EMBODIMENTS

Figure 1:
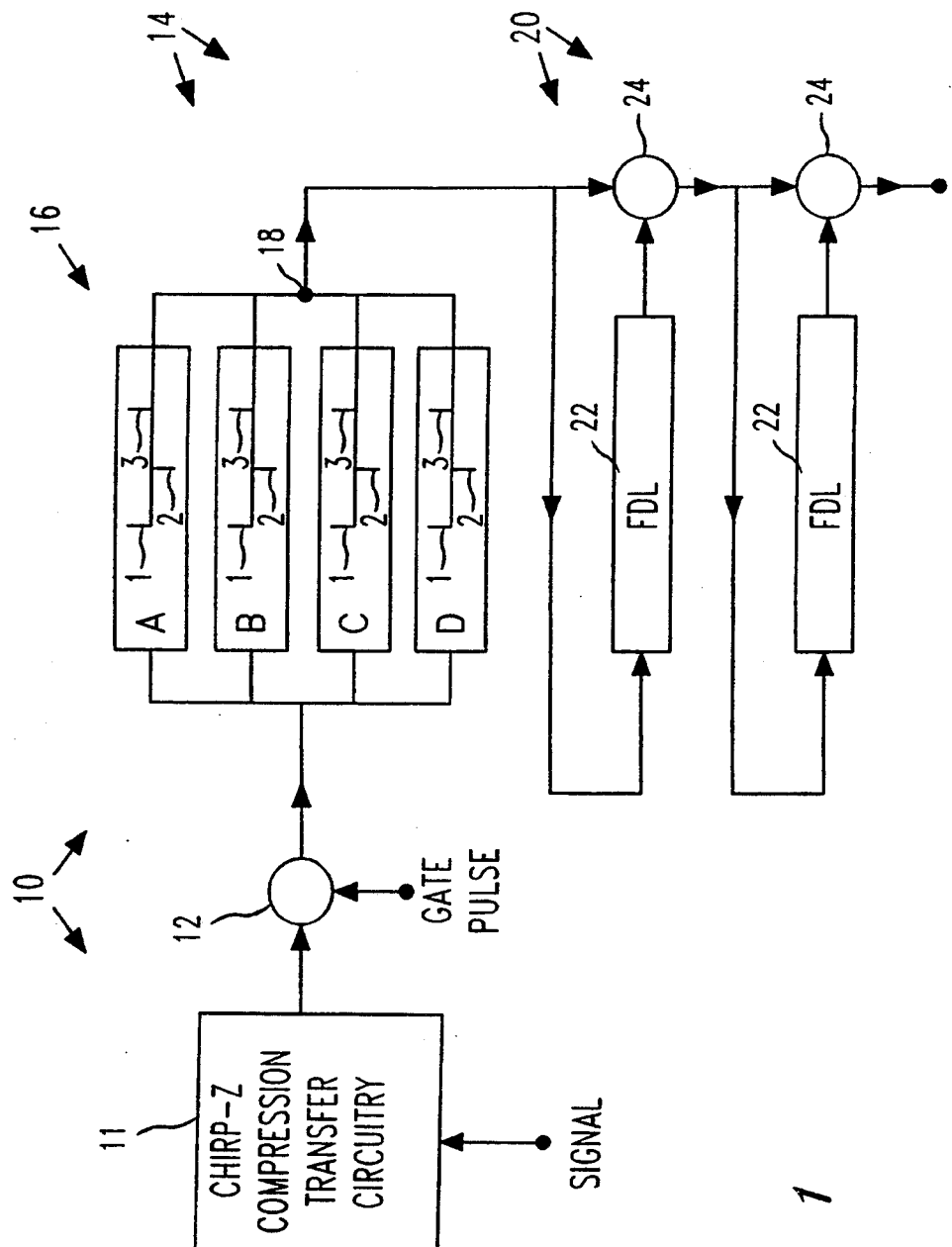
FIG. 1 is a block diagram illustration for the preferred embodiments of this invention.

A signal analyzer 10 in accordance with the preferred embodiments of the invention, is shown in FIG. 1. As is conventional in the art of signal analysis, circuitry 11 for deriving a Chirp-Z transform is utilized in analyzer 10 to compress the individual CW components of the signal into segregated pulses or time intervals of equal duration. Of course, each CW component has a single frequency characteristic and the Chirp-Z pulse thereof appears once during each scan of a sweeping local oscillator (not shown). Use of Chirp-Z transforms has been well known, at least since R. M. Hays et al. presented SURFACE WAVE TRANSFORM ADAPTABLE PROCESSOR SYSTEM, pages 363–370 of the 1975 Ultrasonics Symposium Proceedings, IEEE Catalogue No. 75 CHO 994-4SU which is incorporated by reference herein. Forward Chirp-Z transforms are conventionally implemented derived or by mixing the signal with the output of the sweeping local oscillator and compressing the result with a filter to focus on a predetermined frequency.

Forward Chirp-Z transform pulses are selectively gated through a modulator or switch 12 in FIG. 1 and pass to a sequential circuit means 14 for recreating a selected CW component by repeatedly replicating the Chirp-Z pulses that relate thereto. This replicating is performed at the rate necessary to separate the pulse replications by one-half the pulse width or duration of one pulse, and over the time period required to accomplish the functional purpose of the analyzer 10. Modulator 12 is controlled by a gate signal in accordance with the functional purpose of the analyzer 10. Such functional purposes are well known, for example a particular Chirp-Z pulse of a selected CW component could be recreated for any reasonable time, or successive Chirp-Z pulses of a selected CW component could be recreated for the duration of separation therebetween, as shown in FIG. 2(b).

Each Chirp-Z pulse serves as an envelope for the CW component that relates thereto. Such envelopes have a diamond shaped time profile, as shown in FIG. 2(a) wherein sequential Chirp-Z pulses of a selected CW component from consecutive scans of the sweeping local oscillator, are represented. Because the Chirp-Z pulse replications are separated by one-half the width of one such pulse, sequential replications overlap to align adjacent pulse replications in such a manner that the constant wave amplitude of the CW component is recreated, as shown in FIG. 2(c).

Feedback or recirculating circuits that recreate selected CW components from Chirp-Z pulses are well known. However, instability and noise present problems with regard to such circuits and of course, these problems limit the functional purposes to which such circuits can be applied. Circuit means 14 to which the invention relates is characterized as "sequential" because it includes no feedback or recirculating loops. Consequently, sequential circuit means 14 is much more stable and noise free than are the prior art feedback or recirculating circuits.

In the preferred embodiments, the envelope of the Chirp-Z pulse for the selected CW component to be recreated, Is directed to a tapped delay line (hereinafter TDL) 16 in the sequential circuit means 14, as shown in FIG. 1. A single replication is taken from each tap on the TDL 16 and therefore, subsequent taps thereon are separated by a delay equal to one-half the duration of one Chirp-Z pulse. Where the functional purpose of the analyzer 10 requires a number of replications that is within the reasonable capability of the TDL 16 to provide taps, the recreation of the CW components is taken from the output terminal 18 of the TDL 16. Only a group of replications is derived from the TDL 16 when the required number of replications is beyond the reasonable capability thereof. However, circuitry 20 for duplicating that group of replications in powers of two is then combined with the TDL 16 to derive the number of Chirp-Z pulse replications required for the functional purpose of the analyzer 10.

Although individual tapped delay lines A, B, C and D are connected in parallel as the TDL 16 shown in FIG. 1, a single tapped delay line or a plurality thereof connected in other arrangements could be utilized. For purposes of example only, each tapped delay line A, B, C and D has three taps 1, 2 and 3 which function in combination to produce 12 replications of a Chirp-Z pulse, that are sequentially separated by one-half the width of one such pulse. To facilitate the fabrication of TDL 16, the taps 1, 2 and 3 of each tapped delay line A, B, C and D are separated by four (4) times that one-half pulse width. Also, Tap B1 is offset relative to Tap A1 by a delay equal to that one-half pulse width, as is Tap C1 relative to Tap B1 and Tap D1 relative to Tap C1. Within TDL 16 consequently, the sequence of taps from which the 12 replications of a Chirp-Z pulse pass to the output terminal 18 are A1, B1, C1, D1, A2, B2, C2, D2, A3, B3, C3 and D3. Of course, any type of tapped delay line device can be utilized in the TDL 16, such as SAW, ACT, CCD or cable.

One preferred embodiment of the duplicating circuit 20 includes a fixed delay line (hereinafter FDL) 22 and summing junction 24 combination for each power of two duplication required, as shown in FIG. 1. The FDL 22 for each power of two duplication has a delay interval equal to the particular power of two multiplied by the time duration occupied by the group of replications to be duplicated. In each such combination, one input of the summing junction 24 and the input of the FDL 22 simultaneously receive the group of replications to be duplicated. The output from the FDL 22 is directed to the other input of the summing junction 24 and the duplicated groups of replications pass from the output of the summing junction 24. Furthermore, amplifiers (not shown) can readily be utilized at appropriate locations to compensate for any delay line losses.

Those skilled in the art will appreciate without any further explanation, that within the concept of this invention, many modifications and variations are possible to the above disclosed embodiments of the signal analyzer circuitry. Consequently, it should be understood that all such modifications and variations fall within the scope of the following claims.

What is claim is:

1. In a signal analyzer wherein a Chirp-Z forward transform is utilized to compress the individual CW components of the signal into segregated pulses of equal duration, with the pulse of each such component appearing once during each scan of a sweeping local oscillator, the improvement comprising:

sequential circuitry for recreating a selected CW component by repeatedly replicating a forward Chirp-Z transform pulse relating thereto throughout a period of time as necessitated by the intended analysis, with the forward Chirp-Z transform pulse for each CW component selected being gated through a switch to a tapped delay line having the taps thereof separated in time by one-half the Chirp-Z pulse width and one pulse replication is taken from each tap.

2. The analyzer of claim 1 wherein the Chirp-Z pulse replications derived from the tapped delay line are directed as a group to circuitry for duplicating the group of replications in powers of two.

3. The analyzer of claim 2 wherein the duplicating circuitry includes a fixed delay line and summing junction combination for each power of two duplication, the fixed delay line in each such combination having a delay interval equal to that combination's particular power of two multiplied by the time duration the group of replications occupies, the first power of two combination receiving the group of replications from the tapped delay line while each power of two combination thereafter receives the group of replications as duplicated by the preceding power of two combination, each power of two combination having the groups of replications directed simultaneously to one input of its summing junction and the input of its fixed delay line, while the output from its fixed delay line is directed to the other input of its summing junction and the duplicated groups of replications pass from the output of its summing junction.

* * * * *